(12) United States Patent
Li

(10) Patent No.: US 7,709,298 B2
(45) Date of Patent: May 4, 2010

(54) SELECTIVELY ALTERING A PREDETERMINED PORTION OR AN EXTERNAL MEMBER IN CONTACT WITH THE PREDETERMINED PORTION

(75) Inventor: Zhiyong Li, Redwood City, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 152 days.

(21) Appl. No.: 11/779,423

(22) Filed: Jul. 18, 2007

(65) Prior Publication Data

US 2009/0020892 A1 Jan. 22, 2009

(51) Int. Cl.
*H01L 21/82* (2006.01)

(52) U.S. Cl. .............. 438/128; 438/623; 438/781; 257/798; 257/784

(58) Field of Classification Search .......... 438/128, 438/623, 781; 257/798, 784
See application file for complete search history.

(56) References Cited

U.S. PATENT DOCUMENTS

| | | | |
|---|---|---|---|
| 7,129,554 B2 | 10/2006 | Lieber et al. | |
| 7,163,659 B2 | 1/2007 | Stasiak et al. | |
| 7,468,271 B2* | 12/2008 | Golovchenko et al. | ... 435/287.2 |
| 2005/0130404 A1* | 6/2005 | Moghadam et al. | ......... 438/623 |
| 2005/0169798 A1 | 8/2005 | Bradley et al. | |
| 2005/0253220 A1 | 11/2005 | Lin et al. | |
| 2006/0014155 A1 | 1/2006 | Hamers et al. | |
| 2006/0125033 A1 | 6/2006 | Segal et al. | |
| 2006/0134799 A1 | 6/2006 | Sharma et al. | |
| 2006/0177946 A1 | 8/2006 | Dubin | |
| 2006/0186556 A1* | 8/2006 | Sung | ................... 257/798 |
| 2006/0269927 A1 | 11/2006 | Lieber et al. | |
| 2007/0053825 A1 | 3/2007 | Li et al. | |
| 2007/0074316 A1* | 3/2007 | Alden et al. | .............. 977/762 |

\* cited by examiner

*Primary Examiner*—Matthew Smith
*Assistant Examiner*—Wilner Jean Baptiste

(57) ABSTRACT

A method for selectively altering a predetermined portion of an object or an external member in contact with the predetermined portion of the object is disclosed. The method includes selectively electrically addressing the predetermined portion, thereby locally resistive heating the predetermined portion, and exposing the object, including the predetermined portion, to the external member.

19 Claims, 2 Drawing Sheets

TO FIG. 2E

SELECTIVELY ALTERING A PREDETERMINED PORTION OR AN EXTERNAL MEMBER IN CONTACT WITH THE PREDETERMINED PORTION

BACKGROUND

The present disclosure relates generally to methods for selectively altering a predetermined portion or an external member in contact with the predetermined portion.

Since the inception of semiconductor technology, a consistent trend has been toward the development of smaller device dimensions and higher device densities. As a result, nanotechnology has seen explosive growth and generated considerable interest. Nanotechnology is centered on the fabrication and application of nano-scale structures, or structures having dimensions that are often 5 to 100 times smaller than conventional semiconductor structures.

Nano-imprint lithography was initiated as a process to achieve nanoscale structures or features (about 100 nm or smaller) with high throughput and relatively low cost in structures such as, for example, molecular electronic devices. During the imprinting process, the nanoscale features are transferred from a mold to a moldable (e.g., polymer) layer. Nanowires are included in the category of nano-scale structures that may be fabricated via nano-imprinting.

Nanowires are wire-like structures having at least one linear dimension (e.g., diameter) ranging from about 1 nm to about 200 nm. Nanowires are suitable for use in a variety of applications, including functioning as conventional wires for interconnection applications or as semiconductor devices. Nanowires are the building blocks of many potential nanoscale devices, such as nano-scale field effect transistors (FETs), p-n diodes, light emitting diodes (LEDs) and nanowire-based sensors, to name a few.

BRIEF DESCRIPTION OF THE DRAWINGS

Features and advantages of embodiments of the present disclosure will become apparent by reference to the following detailed description and drawings, in which like reference numerals correspond to similar, though not necessarily identical, components. For the sake of brevity, reference numerals or features having a previously described function may not necessarily be described in connection with other drawings in which they appear.

DETAILED DESCRIPTION

Embodiments of the method disclosed herein advantageously enable selective control over the alteration of one or more portions of an object, or of an external member in contact with the one or more portions of the object. In some embodiments, the alteration is the functionalization of the portion(s). In other embodiments, the alteration is the transfer of a pattern to the external member(s). The embodiments disclosed herein take advantage of localized resistive heating to locally initiate chemical reactions.

Figure 1:
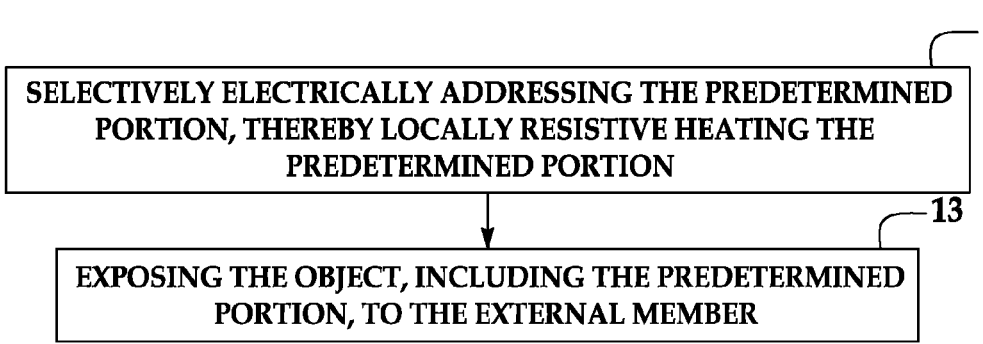
FIG. 1 is a flow diagram depicting an embodiment of the method.

Referring now to FIG. 1, an embodiment for selectively altering a predetermined portion of an object or an external member in contact with the predetermined portion of the object is depicted. Embodiments of the method generally includes selectively electrically addressing the predetermined portion, thereby locally resistive heating the predetermined portion, as shown at reference numeral 11, and exposing the object, including the predetermined portion, to the external member, as shown at reference numeral 13. It is to be understood that this and other embodiments of the method and apparatus are described in further detail in reference to the other figures hereinbelow.

FIGS. 2A through 2E schematically depict one embodiment of the method shown in FIG. 1. In this embodiment of the method, predetermined portion(s) 18 of the object 10 is/are selectively altered (compare FIGS. 2A and 2E). The object 10 in this embodiment is an array 100 (e.g., a high density array) of nanostructures 12, 12', 12" (shown in FIG. 2A).

Any suitable nanostructures 12, 12', 12" may be used. A nanostructure 12, 12', 12", as used herein, is any semi-conducting or conducting structure having at least one dimension on the nanoscale (i.e., ranging from about 1 nm to about 200 nm). Non-limiting examples of suitable nanostructures 12, 12', 12" include nanowires, nanotubes, nanobelts, nanosprings, or the like, or combinations thereof. Examples of semi-conducting or conducting materials that are suitable for forming the nanostructures 12, 12', 12" include silicon, germanium, carbon, zinc oxide, tin oxide, titanium oxide, gallium arsenide, indium phosphate, platinum, gold, silver, nickel, or the like, or combinations thereof.

In an embodiment, the nanostructures 12, 12', 12" may be established on a substrate 14. Examples of suitable substrates include, but are not limited to silicon, glass, quartz, aluminum oxide, silicon nitride, silicon oxide, or the like, or combinations thereof. In other embodiments, the nanostructures 12, 12', 12" may be suspended. One example of such a suspended nanostructure 12, 12', 12" may be a silicon nanowire bridge in a trench defined by two silicon islands on a SOI (silicon-on-insulator) substrate. It is to be understood that other materials may be used for the bridge, e.g., or germanium, ZnO, carbon tubes, tin oxide, titanium oxide, gallium arsenide, indium phosphate, platinum, gold, silver, nickel, or the like, or combinations thereof.

Figure 2A:
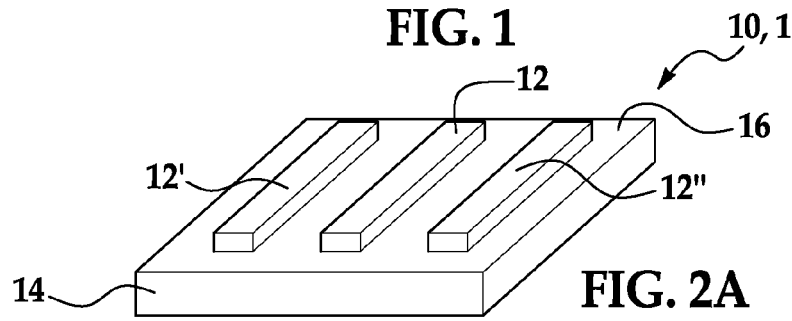
FIGS. 2A through 2E are schematic and perspective views of an embodiment of the method of selectively altering a predetermined portion of an object.

While the nanostructure 12, 12', 12" in FIG. 2A are shown as being established horizontally with respect to the substrate surface 16, it is to be understood that the nanostructure 12, 12', 12" may also be established vertically and/or at any suitable angle with respect to the substrate surface 16. The nanostructure 12, 12', 12" may be grown or formed using any suitable technique. Some non-limiting examples include growing the nanostructure 12, 12', 12" from the substrate surface 16 using a catalyst and a reactive gas, forming the nanostructure 12, 12', 12" using nano-imprinting techniques, e-beam lithography, or other like methods. Non-limiting examples of forming the nanostructures 12, 12', 12" are further described in U.S. Pat. No. 6,815,706, issued Nov. 9, 2004, incorporated herein by reference in its entirety.

Figure 2B:
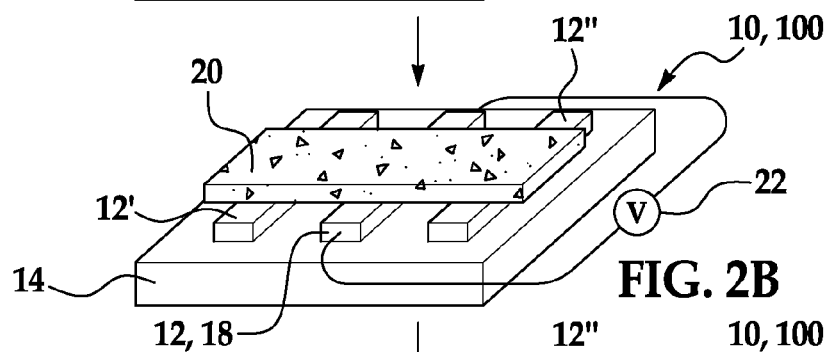

FIG. 2B depicts both the steps of selectively electrically addressing the predetermined portion 18, and exposing the object 10, including the predetermined portion 18, to the external member 20. As shown in FIG. 2B, in this embodiment of the method the predetermined portion 18 is the nanostructure 12.

Selectively electrically addressing the predetermined portion 18 is accomplished by electrically connecting the terminals of any one or more of the nanostructures 12, 12', 12" in the array 100 to an external voltage or current source 22. In an embodiment, one nanostructure 12 is electrically addressed at a time. It is to be understood, however, that the predetermined portion 18 may be made up of any number of the nanostructures 12, 12', 12", for example, if it is desirable to functionalize two or more nanostructures 12, 12', 12" in the same manner. As a non-limiting example, the predetermined portion 18 includes a group of nanostructures 12, 12', 12" that is less than the entire array 100 of nanostructures 12, 12', 12". Generally, while one or more nanostructures 12, 12', 12" is being electrically addressed, the remainder of the nanostructures 12, 12', 12" are grounded or floated.

As shown in FIG. 2B, the external member 20 is exposed to at least the predetermined portion 18 of the object 10 as the voltage or current bias is applied. Applying the voltage or current bias causes the predetermined portion 18 to be locally resistive heated. It is to be understood that the voltage or current bias may be controlled such that the temperature of the predetermined portion 18 is sufficient to initiate a chemical reaction on a surface of the predetermined portion 18 (in this case nanostructure 12) with the external member 20. This temperature and type of reaction will depend, at least in part, upon the material of the predetermined portion 18, the surface properties of the predetermined portion 18, the external member(s) 20 used, and/or combinations thereof.

The chemical reaction results in the functionalization of the predetermined portion 18/nanowire 12. Examples of chemical reactions that may be initiated include thermally activated addition reactions, thermal radical reactions, thermal polymerization reactions, and/or combinations thereof. It is to be understood that the external member(s) 20 may contact the remainder of the object 10 (as shown in FIG. 2B) without functionalizing the surfaces of the other nanostructures 12', 12" in the array 100, in part because the other nanostructures 12', 12" are not locally heated. In an embodiment, the external member 20 is deposited (at least on the predetermined portion 18) via spin-coating, cast coating, chemical vapor deposition, or via any other suitable coating technique.

In this embodiment of the method, the external member(s) 20 is/are a molecular species. Any desirable molecular species that is capable of reacting with the predetermined portion 18, or with the predetermined portion 18 and another functional molecule may be selected. In an embodiment, the molecular species is selected from radical initiators, linker molecules (e.g., amine-terminated compounds, thiol-terminated compounds, acryl-terminated compounds, carboxyterminated compounds, etc.), alkenes, alkynes, diazo-derivatives, functional molecules (e.g., DNA, proteins, polypeptides, other chemical or biological species, etc.), or combinations thereof.

In one non-limiting example, the predetermined portion 18/nanostructure 12 is a silicon nanowire having hydrogen termination groups when exposed to certain conditions. Upon exposure to resistive heating and the external member 20 (e.g., alkenes, alkynes, diazo-derivatives, etc.), the external member 20 reacts with the hydrogen termination groups on the nanowire surface to achieve surface functionalization.

In embodiments in which linker molecules are used, it is to be understood that such molecules may react with the predetermined portion 18/nanostructure 12 surface, and then may be used to attach other functional molecules (such as chemical or biological species) to the predetermined portion 18/nanostructure 12 to achieve functionalization. As such, some embodiments of the method may include a combination of external members 20.

In another non-limiting example, the external member 20 is a radical initiator that forms radicals when exposed to temperatures ranging from about 40° C. and about 200° C. Upon locally resistive heating the predetermined portion 18/nanostructure 12 to a temperature within the 40° C.-200° C. range, thermal radical initiated polymerization results between the external member 20 and surface groups of the predetermined portion 18/nanostructure 12, thereby selectively functionalizing the predetermined portion 18/nanostructure 12.

Figure 2C:
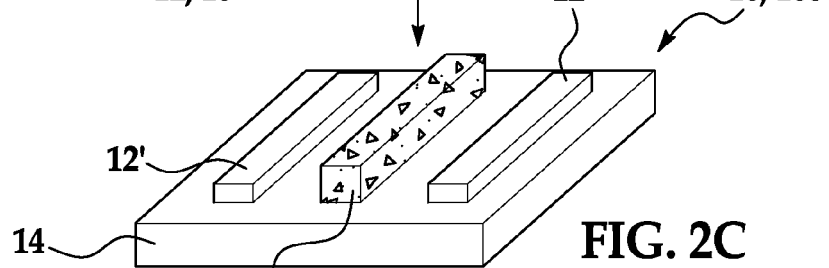

After the chemical reaction is complete, the remaining external member 20 may be removed, as shown in FIG. 2C. In this embodiment, the external member 20 may be removed via rinsing. As non-limiting examples, isopropyl alcohol, acetone, chlorobenzene, or the like, or combinations thereof may be used to remove the remaining external member 20. As shown in FIG. 2C, the predetermined portion 18/nanostructure 12 is selectively altered to have a functionalized surface (denoted by the triangular pattern).

Figure 2D:
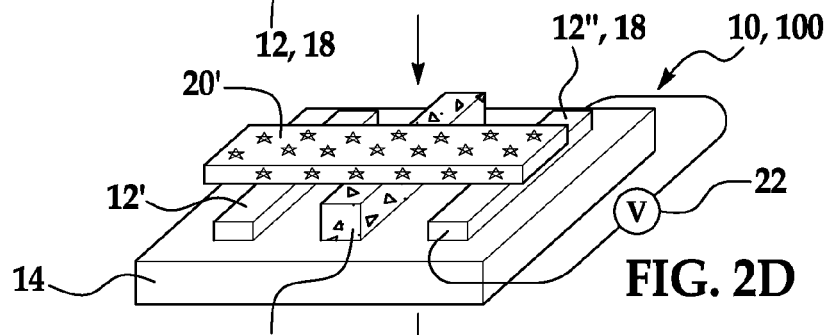

It is to be understood that the selective altering process may be repeated as desired to selectively functionalize other nanostructures 12', 12" in the array 100. As shown in FIG. 2D, another nanostructure 12" is selected as the predetermined portion 18. In this embodiment, the predetermined portion 18/nanostructure 12" is connected to the external voltage or current source 22 and is exposed to the external member 20'. Generally, a subsequent functionalization process involves a different external member(s) 20' (denoted by the different pattern from that shown in FIG. 2B) than that which is used in a previous functionalization process. As previously described, applying the voltage or current bias causes the predetermined portion 18 to be locally resistive heated to a temperature sufficient to cause a chemical reaction on the surface of the predetermined portion 18/nanostructure 12" and the external member 20'. The chemical reaction results in the functionalization of the predetermined portion 18/nanostructure 12".

Figure 2E:
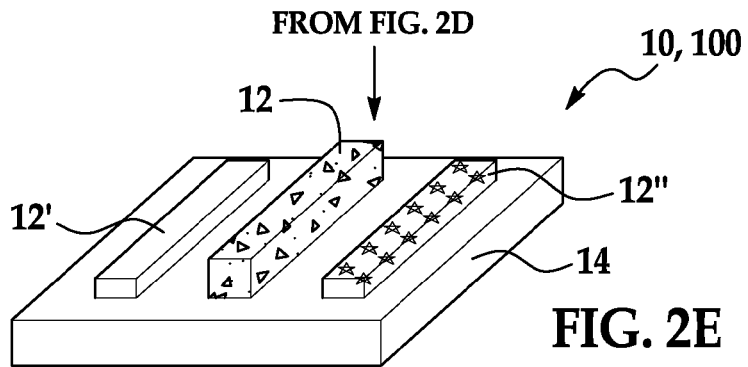

FIG. 2E depicts the selectively altered object 10/array 100 having two different selectively functionalized nanostructures 12, 12", and the second external member 20' removed.

The selectively altered nanostructure array 100 may be used in a variety of applications, including chemical and biological sensing. It is believed that the different functionalization of the nanostructures 12, 12', 12" offers parallel, versatile, multi-function, and real-time detection of multiple species (e.g., analyte molecules or other targets).

Figure 3A:
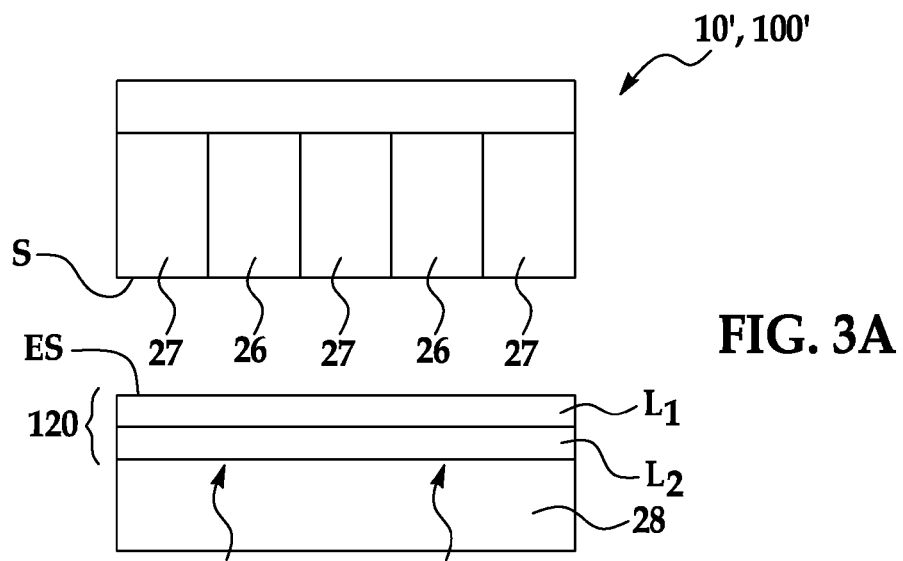
FIGS. 3A through 3C are schematic cross-sectional views of an embodiment of selectively altering an external member in contact with a predetermined portion of an object.
Figure 3B:
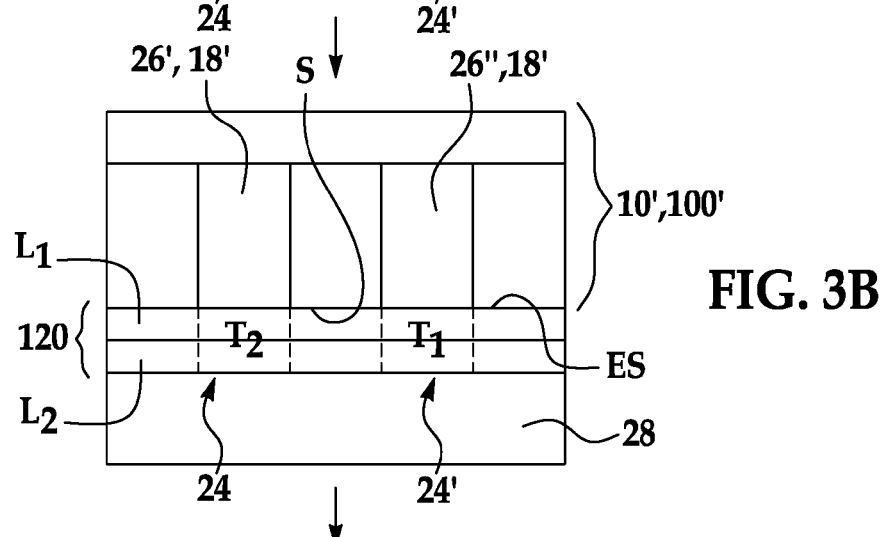
Figure 3C:
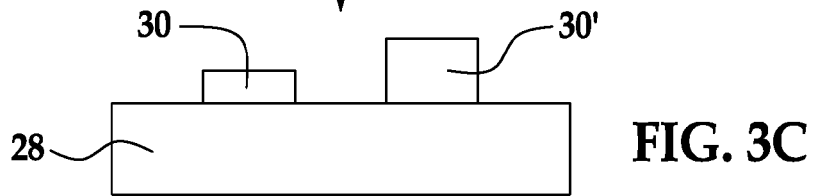

Referring now to FIGS. 3A through 3C, another embodiment of the method shown in FIG. 1 is schematically depicted. Generally, in this embodiment of the method, portions 24, 24' of the external member 120 in contact with the predetermined portion(s) 18' of the object 10' is/are selectively altered. The object 10' in this embodiment is a mold 100' having a plurality of features 26 (shown in FIG. 3A).

It is to be understood that the term "in contact with" is broadly defined herein to encompass a variety of divergent layering arrangements and assembly techniques. These arrangements and techniques include, but are not limited to (1) the direct attachment of the predetermined portion 18' to a layer $L_1$ of the external member 120 with no intervening material layers therebetween; and (2) the attachment of the predetermined portion 18' to a layer $L_2$ of the external member 120 with one or more layers (e.g., $L_1$) therebetween, provided that the one layer $L_1$ being "established on" or "deposited on" the other layer $L_2$ is somehow "supported" by the other layer $L_2$ (notwithstanding the presence of one or more additional material layers therebetween).

In FIG. 3A, both the mold 100', and the external member 120 to be altered are depicted. The mold 100' includes numerous features 26. It is to be understood that the mold 100' may include one feature 26, or a plurality of features 26. While the features 26 may be of any desirable size, in an embodiment, the features 26 are nano-scale features, i.e., at least one dimension ranges from 1 nm to about 200 nm.

Generally, the features 26 are separated by a material 27. In one embodiment, the features 26 and the material 27 are different materials, such that each feature 26 may be selectively locally heated. It is to be understood that the material 27 between the features 26 is selected to insulate the electricity and thermal conductivity.

As a non-limiting example, the mold 100' may be a super lattice structure, in which the features 26 are formed of aluminum gallium arsenide, and the material 27 is formed of gallium arsenide. In another example, features 26 are formed of tantalum, and the material 27 is formed of tantalum oxide. In yet another example, features 26 are formed of silicon, and the material 27 is formed of silicon oxide or silicon nitride.

The object 100' shown in FIG. 3A has a substantially flat surface S. In one embodiment, the material 27 is established between the features 26. The deposition processes used may result in some of the material 27 being established on the features 26. The object 100' may then be chemically mechanically polished to remove the excess material 27 and form the surface S having exposed edges of the material 27 and the features 26.

In this embodiment of the method, the external member 120 is a moldable material having one or more layers $L_1$, $L_2$ established on a substrate 28. As depicted in FIG. 3A, the moldable material includes two layers $L_1$, $L_2$. Generally, the moldable material is a thermal resist. Non-limiting examples of suitable moldable materials include methyl methacrylate, benzylmethacrylate, other methacrylate derivatives, carbonate derivatives, dimethylsiloxane, other siloxane derivatives, epoxy derivatives, or the like, or combinations thereof. It is to be understood that the various layers $L_1$, $L_2$ of the external member 120 may be selected such that they cure at the same or at different temperatures.

FIG. 3B depicts the mold 100' placed into contact with an exterior surface ES of the layers $L_1$, $L_2$ of the external member 120. One or more features 26', 26" of the mold 100' is/are selected as the predetermined portion 18', and is/are selectively electrically addressed. The feature(s) 26', 26" of the mold 100' selected as the predetermined portion(s) 18' may be electrically addressed by electrically connecting the feature(s) 26', 26" to an external voltage or current source (not shown). In an embodiment, one feature 26', 26" is electrically addressed at a time. It is to be understood, however, that the predetermined portion 18' may be made up of any number of the features 26', 26" (as shown in FIG. 3B) that are electrically addressed substantially simultaneously, for example, if it is desirable to transfer the pattern of two or more features 26', 26" at the same time.

In this embodiment of the method, the voltage or current bias applied to each feature 26', 26" is controlled such that the predetermined portion(s) 18'/feature(s) 26', 26" is/are resistive heated to a temperature that is sufficient to cure one or more layers $L_1$, $L_2$ the moldable material located within a predetermined distance from the predetermined portion(s) 18'/feature(s) 26', 26". This enables the respective feature 26', 26" patterns to be transferred to those portions 24, 24' of the external member 120/moldable material having a suitable curing temperature and positioned within the predetermined distance beneath with the predetermined portion(s) 18'. Generally, the predetermined distance depends, at least in part, on the voltage/current applied, the materials selected for the features 26, the materials selected for the external member 120, or combinations thereof. In an embodiment, the external member 120/moldable material located within about 500 nm from the predetermined portion(s) 18'/feature(s) 26', 26" may be cured. Generally, the layers $L_1$, $L_2$ have thicknesses within the predetermined distance such that the heat from the predetermined portion 18' dissipates into the layers $L_1$, $L_2$.

It is to be understood that those areas of the external member 120/moldable material not heated and not within the predetermined distance will remain uncured and unpatterned when the mold 100' is removed from the external surface ES of the external member 120.

As previously stated, if the external member 120/moldable material includes multiple layers $L_1$, $L_2$, the layers $L_1$, $L_2$ may have the same or different curing temperatures. In embodiments in which the layers $L_1$, $L_2$ have the same curing temperature and more than one feature 26', 26" is selected as the predetermined portion 18', each of the selected features 26', 26" may be heated to the same temperature to achieve curing and pattern transfer.

FIG. 3B illustrates an embodiment in which the layers $L_1$, $L_2$ have different curing temperatures $T_1$, $T_2$. If it is desirable to transfer the pattern of the predetermined portion 18'/feature 26' to the layer $L_2$ at one portion 24 of the external member 120, and to transfer the pattern of the predetermined portion 18'/feature 26" to both layers $L_1$, $L_2$ at another portion 24', the feature 26' is selectively heated to the second temperature $T_2$ (i.e., the curing temperature of the second layer $L_2$), and the other feature 26" is selectively heated to the first temperature $T_1$ (i.e., the curing temperature of the first layer $L_1$). The selective heating of the features 26', 26" may be accomplished sequentially or substantially simultaneously. In an embodiment, the second or bottommost layer $L_2$ is selected to have the smaller curing temperature, such that when it is desirable to cure the second or bottommost layer $L_2$ alone, the temperature to which the feature 26' is raised will not be sufficient to cure both layers $L_1$, $L_2$.

As a non-limiting example, the external member 120/moldable material may be formed of the first layer $L_1$ having a cure temperature of 200° C., and the second layer $L_2$ having a cure temperature of 100° C. If it is desirable to cure layer $L_2$ at one portion 24, and layers $L_1$, $L_2$ at another portion 24', two different features 26', 26" are selected as the predetermined portion 18'. The first feature 26' is heated to 100° C., and the second feature 26" is heated to 200° C. The resistive heating causes the layer(s) $L_1$ and/or $L_2$ (depending on the temperature of the feature 26', 26" and the curing temperature of the layer $L_1$, $L_2$) to cross-link and cure. As such, the feature 26' pattern will be transferred to the second layer $L_2$ at portion 24, and the feature 26" pattern will be transferred to both layers $L_1$, $L_2$ at the other portion 24'. A non-limiting example of such a structure is shown in FIG. 3C.

Once curing of the desirable portions 24, 24' of the external member 120/moldable material is accomplished; the mold 100' may be removed. It is to be understood that any uncured portions will not retain the pattern of the mold 100' upon its removal from the external member 120/moldable material. Such uncured portions may be removed, as shown in FIG. 3C. The resulting external member 120/moldable material is selectively altered as a result of the method. It is to be understood that in this embodiment of the method, any desirable number of features 26, 26', 26" may be selectively addressed, such that the respective patterns are transferred to desirable portions 24, 24' of the external member 120/moldable material.

As shown in the FIG. 3 series, a one-step pattern transfer process results in the formation of at least two features 30, 30' (see FIG. 3C) having different heights. It is believed that such features 30, 30' may advantageously allow self-aligned multilayered structure fabrication when combined with proper etching and liftoff processes. This embodiment of the method also transfers one or more feature 26, 26', 26" patterns with a mold having a flat surface, which eliminates the imprinting of the mold 100' into the external member 120/moldable material. It is believed that the lack of imprinting prolongs the life of the features 26 and the mold 100'.

Embodiments of the method disclosed herein include, but are not limited to the following advantages. The alteration of one or more portions of an object 100, or of an external member 120 in contact with the one or more portions of an object 100' may be selectively controlled. In some embodiments, the alteration is the selective functionalization of nanostructures 12, 12', 12" in an array 100. In other embodiments, the alteration is the selective transfer of a pattern to a moldable material.

While several embodiments have been described in detail, it will be apparent to those skilled in the art that the disclosed embodiments may be modified. Therefore, the foregoing description is to be considered exemplary rather than limiting.

What is claimed is:

1. A method for selectively altering a predetermined portion of an object or an external member in contact with the predetermined portion of the object, the method comprising:
    selectively electrically addressing the predetermined portion, thereby locally resistive heating the predetermined portion;
    exposing the object, including the predetermined portion, to the external member, thereby initiating a chemical reaction at a surface of the predetermined portion of the object or initiating curing of the external member in contact with the predetermined portion; and
    performing the selective electrical addressing and the exposing of the object such that the predetermined portion is heated for at least a portion of a time that the object is exposed to the external member.

2. The method as defined in claim 1 wherein the object is an array of at least semi-conducting nanostructures and wherein the predetermined portion is one nanostructure in the array.

3. The method as defined in claim 2 wherein the at least semi-conducting nanostructures are formed of silicon, germanium, carbon, zinc oxide, tin oxide, titanium oxide, gallium arsenide, indium phosphate, platinum, gold, silver, nickel, and combinations thereof.

4. The method as defined in claim 2, further comprising controlling a voltage bias applied to the nanostructure such that a temperature of the nanostructure is sufficient to initiate the chemical reaction on a surface of the nanostructure with the external member, thereby selectively functionalizing the nanostructure.

5. The method as defined in claim 4 wherein the chemical reaction is a thermal activated addition reaction, a thermal radical reaction, a thermal polymerization reaction, or combinations thereof.

6. The method as defined in claim 4 wherein the external member is a linker molecule that attaches to the surface of the nanostructure, and wherein the method further comprises attaching a functional molecule to the linker molecule.

7. The method as defined in claim 4 wherein other nanostructures in the array remain non-functionalized.

8. The method as defined in claim 4, further comprising:
    exposing the array, including an other nanostructure, to an other external member; and
    selectively electrically addressing the other nanostructure such that a temperature of the other nanostructure is sufficient to initiate a chemical reaction on a surface of the other nanostructure with the other external member, thereby selectively functionalizing the other nanostructure.

9. The method as defined in claim 8 wherein the external member is a first molecular species, and the other external member is a second molecular species that is different from the first molecular species.

10. The method as defined in claim 2 wherein selectively electrically addressing is accomplished by applying a voltage bias to two terminals of the nanowire.

11. The method as defined in claim 1 wherein curing of the external member in contact with the predetermined portion is initiated via the method, wherein the object is a mold having a plurality of features, wherein the predetermined portion is a feature of the mold, and wherein the external member is a moldable material.

12. The method as defined in claim 11 wherein the feature is a nano-feature.

13. The method as defined in claim 11 wherein exposing the object to the external member is accomplished by contacting the mold with the moldable material, and wherein the method further comprises controlling a voltage bias applied to the feature such that a temperature of the feature is sufficient to cure the moldable material located within a predetermined distance from the feature, thereby transferring a pattern of the feature to the moldable material.

14. The method as defined in claim 13 wherein the predetermined distance ranges from about 10 nm to about 500 nm.

15. The method as defined in claim 13 wherein the moldable material includes at least two layers, each having a different curing temperature, and wherein the temperature of the feature is sufficient to cure each of the at least two layers within the predetermined distance from the feature.

16. The method as defined in claim 13 wherein moldable material outside the predetermined distance remains substantially uncured and unpatterned.

17. The method as defined in claim 13, further comprising selectively electrically addressing at least one other feature such that a temperature of the at least one other feature is sufficient to cure the moldable material within a predetermined distance from the at least one other feature, thereby transferring a pattern of the at least one other feature to the moldable material.

18. The method as defined in claim 11 wherein the moldable material includes a plurality of layers, at least two of which are curable at different temperatures, wherein exposing the object to the external member is accomplished by contacting the mold with a surface of one of the at least two layers of the moldable material, and wherein the method further comprises:
    controlling a voltage bias applied to the feature such that a temperature of the feature is sufficient to cure one of the at least two of the plurality of layers; and
    controlling a voltage bias applied to an other feature such that a temperature of the other feature is sufficient to cure an other of the at least two of the plurality of layers.

19. The method as defined in claim 11 wherein the moldable material is selected from methyl methacrylate, benzylmethacrylate, other methacrylate derivatives, carbonate derivatives, dimethylsiloxane, other siloxane derivatives, epoxy derivatives, and combinations thereof.

* * * * *

UNITED STATES PATENT AND TRADEMARK OFFICE
CERTIFICATE OF CORRECTION

PATENT NO. : 7,709,298 B2  Page 1 of 1
APPLICATION NO. : 11/779423
DATED : May 4, 2010
INVENTOR(S) : Zhiyong Li It is certified that error appears in the above-identified patent and that said Letters Patent is hereby corrected as shown below:

In column 8, lines 62-63, in Claim 19, delete "benzylmetharcrylate," and insert -- benzylmethacrylate, --, therefor.

Signed and Sealed this

Fifth Day of October, 2010

David J. Kappos
*Director of the United States Patent and Trademark Office*